United States Patent
Lu et al.

(10) Patent No.: US 10,840,215 B2
(45) Date of Patent: Nov. 17, 2020

(54) SAWING UNDERFILL IN PACKAGING PROCESSES

(71) Applicant: Taiwan Semiconductor Manufacturing Company, Ltd., Hsinchu (TW)

(72) Inventors: Szu-Wei Lu, Hsinchu (TW); Ying-Da Wang, Taipei (TW); Li-Chung Kuo, Taipei (TW); Jing-Cheng Lin, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/483,689

(22) Filed: Apr. 10, 2017

(65) Prior Publication Data
US 2017/0213809 A1    Jul. 27, 2017

Related U.S. Application Data

(62) Division of application No. 13/356,173, filed on Jan. 23, 2012, now Pat. No. 9,620,430.

(51) Int. Cl.
*H01L 23/12* (2006.01)
*H01L 23/48* (2006.01)
(Continued)

(52) U.S. Cl.
CPC ........ *H01L 25/0655* (2013.01); *H01L 21/561* (2013.01); *H01L 21/563* (2013.01);
(Continued)

(58) Field of Classification Search
CPC ............. H01L 25/0655; H01L 25/0657; H01L 25/071; H01L 25/072; H01L 25/0753; H01L 25/115; H01L 25/162; H01L 25/50; H01L 21/565; H01L 21/78; H01L 23/3178; H01L 23/3185; H01L 23/5384; H01L 2924/15–15151; H01L 2924/153; H01L 2924/163–1632; H01L 2924/364; H01L 2924/15311; H01L 2924/18161; H01L 2933/0033; H01L 2924/12042; H01L 2924/181; H01L 2924/00014;
(Continued)

(56) References Cited

U.S. PATENT DOCUMENTS

| 4,811,082 A | 3/1989 | Jacobs et al. |
| 4,990,462 A | 2/1991 | Sliwa, Jr. |

(Continued)

FOREIGN PATENT DOCUMENTS

CN        1461050 A    12/2003

*Primary Examiner* — Natalia A Gondarenko
(74) *Attorney, Agent, or Firm* — Slater Matsil, LLP

(57) ABSTRACT

A method includes bonding a first and a second package component on a top surface of a third package component, and dispensing a polymer. The polymer includes a first portion in a space between the first and the third package components, a second portion in a space between the second and the third package components, and a third portion in a gap between the first and the second package components. A curing step is then performed on the polymer. After the curing step, the third portion of the polymer is sawed to form a trench between the first and the second package components.

20 Claims, 16 Drawing Sheets

(51) Int. Cl.
*H01L 23/52* (2006.01)
*H01L 23/28* (2006.01)
*H01L 23/29* (2006.01)
*H01L 23/31* (2006.01)
*H01L 23/538* (2006.01)
*H01L 25/00* (2006.01)
*H01L 25/03* (2006.01)
*H01L 25/065* (2006.01)
*H01L 23/00* (2006.01)
*H01L 21/56* (2006.01)
*H01L 21/78* (2006.01)

(52) U.S. Cl.
CPC ............ *H01L 21/565* (2013.01); *H01L 21/78* (2013.01); *H01L 23/3135* (2013.01); *H01L 23/3178* (2013.01); *H01L 23/3185* (2013.01); *H01L 24/94* (2013.01); *H01L 24/97* (2013.01); *H01L 25/0652* (2013.01); *H01L 24/05* (2013.01); *H01L 24/06* (2013.01); *H01L 24/11* (2013.01); *H01L 24/13* (2013.01); *H01L 24/14* (2013.01); *H01L 24/16* (2013.01); *H01L 24/32* (2013.01); *H01L 24/73* (2013.01); *H01L 24/83* (2013.01); *H01L 24/92* (2013.01); *H01L 2224/0401* (2013.01); *H01L 2224/0557* (2013.01); *H01L 2224/05569* (2013.01); *H01L 2224/06181* (2013.01); *H01L 2224/11464* (2013.01); *H01L 2224/13147* (2013.01); *H01L 2224/13155* (2013.01); *H01L 2224/1403* (2013.01); *H01L 2224/14181* (2013.01); *H01L 2224/16145* (2013.01); *H01L 2224/16225* (2013.01); *H01L 2224/16227* (2013.01); *H01L 2224/32145* (2013.01); *H01L 2224/32225* (2013.01); *H01L 2224/73204* (2013.01); *H01L 2224/83862* (2013.01); *H01L 2224/83874* (2013.01); *H01L 2224/92125* (2013.01); *H01L 2224/93* (2013.01); *H01L 2224/94* (2013.01); *H01L 2224/97* (2013.01); *H01L 2225/06513* (2013.01); *H01L 2225/06541* (2013.01); *H01L 2924/00014* (2013.01); *H01L 2924/10156* (2013.01); *H01L 2924/10253* (2013.01); *H01L 2924/10271* (2013.01); *H01L 2924/10272* (2013.01); *H01L 2924/12042* (2013.01); *H01L 2924/14* (2013.01); *H01L 2924/1431* (2013.01); *H01L 2924/1434* (2013.01); *H01L 2924/157* (2013.01); *H01L 2924/15311* (2013.01); *H01L 2924/181* (2013.01); *H01L 2924/18161* (2013.01); *H01L 2924/3511* (2013.01)

(58) Field of Classification Search
CPC . H01L 2924/10253; H01L 2924/10271; H01L 2924/10272; H01L 2924/13; H01L 2924/1431; H01L 2924/1434; H01L 2924/157; H01L 2924/3511; H01L 24/94; H01L 24/97; H01L 24/73; H01L 24/83; H01L 24/92; H01L 24/05; H01L 24/06; H01L 24/11; H01L 24/13; H01L 24/14; H01L 24/16; H01L 24/32; H01L 2224/16227; H01L 2224/83874; H01L 2224/05569; H01L 2224/0401; H01L 2224/0557; H01L 2224/06181; H01L 2224/11464; H01L 2224/13147; H01L 2224/48137; H01L 2224/13155; H01L 2224/1403; H01L 2224/14181; H01L 2224/83862; H01L 2224/92125; H01L 2224/16145; H01L 2224/16225; H01L 2224/32145; H01L 2224/32225; H01L 2224/73204; H01L 2224/94; H01L 2224/48135; H01L 2224/48145; H01L 2224/48151; H01L 25/0652; H01L 21/561; H01L 21/563; H01L 23/3135; H01L 2225/06513; H01L 2225/06541; H01L 2924/14; H01L 2224/93; H01L 2224/97; H01L 2924/10156
USPC ....... 257/621, 620, 618, 778, 723, 787, 737, 257/738, 685; 438/462, 113, 458, 460, 438/464, 108
See application file for complete search history.

(56) References Cited

U.S. PATENT DOCUMENTS

| | | |
|---|---|---|
| 5,075,253 A | 12/1991 | Sliwa, Jr. |
| 5,380,681 A | 1/1995 | Hsu |
| 5,481,133 A | 1/1996 | Hsu |
| 6,002,177 A | 12/1999 | Gaynes et al. |
| 6,066,513 A | 5/2000 | Pogge et al. |
| 6,075,289 A * | 6/2000 | Distefano ............ H01L 23/3121 257/699 |
| 6,187,678 B1 | 2/2001 | Gaynes et al. |
| 6,229,216 B1 | 5/2001 | Ma et al. |
| 6,236,115 B1 | 5/2001 | Gaynes et al. |
| 6,271,059 B1 | 8/2001 | Bertin et al. |
| 6,279,815 B1 | 8/2001 | Correia et al. |
| 6,355,501 B1 | 3/2002 | Fung et al. |
| 6,434,016 B2 | 8/2002 | Zeng et al. |
| 6,448,661 B1 | 9/2002 | Kim et al. |
| 6,461,895 B1 | 10/2002 | Liang et al. |
| 6,562,653 B1 | 5/2003 | Ma et al. |
| 6,562,663 B2 | 5/2003 | Scheifers et al. |
| 6,570,248 B1 | 5/2003 | Ahn et al. |
| 6,600,222 B1 | 7/2003 | Levardo |
| 6,607,938 B2 | 8/2003 | Kwon et al. |
| 6,661,085 B2 | 12/2003 | Kellar et al. |
| 6,762,076 B2 | 7/2004 | Kim et al. |
| 6,790,748 B2 | 9/2004 | Kim et al. |
| 6,794,273 B2 * | 9/2004 | Saito .................... H01L 21/4857 257/618 |
| 6,887,769 B2 | 5/2005 | Kellar et al. |
| 6,908,565 B2 | 6/2005 | Kim et al. |
| 6,908,785 B2 | 6/2005 | Kim |
| 6,924,551 B2 | 8/2005 | Rumer et al. |
| 6,943,067 B2 | 9/2005 | Greenlaw |
| 6,946,384 B2 | 9/2005 | Kloster et al. |
| 6,975,016 B2 | 12/2005 | Kellar et al. |
| 7,037,804 B2 | 5/2006 | Kellar et al. |
| 7,056,807 B2 | 6/2006 | Kellar et al. |
| 7,087,538 B2 | 8/2006 | Staines et al. |
| 7,151,009 B2 | 12/2006 | Kim et al. |
| 7,157,353 B2 | 1/2007 | Farnworth et al. |
| 7,157,787 B2 | 1/2007 | Kim et al. |
| 7,215,033 B2 | 5/2007 | Lee et al. |
| 7,276,799 B2 | 10/2007 | Lee et al. |
| 7,279,795 B2 | 10/2007 | Periaman et al. |
| 7,307,005 B2 | 12/2007 | Kobrinsky et al. |
| 7,317,256 B2 | 1/2008 | Williams et al. |
| 7,320,928 B2 | 1/2008 | Kloster et al. |
| 7,345,350 B2 | 3/2008 | Sinha |
| 7,402,442 B2 | 7/2008 | Condorelli et al. |
| 7,402,515 B2 | 7/2008 | Arana et al. |
| 7,410,884 B2 | 8/2008 | Ramanathan et al. |
| 7,413,927 B1 | 8/2008 | Patwardhan et al. |
| 7,432,592 B2 | 10/2008 | Shi et al. |
| 7,494,845 B2 | 2/2009 | Hwang et al. |
| 7,528,494 B2 | 5/2009 | Furukawa et al. |
| 7,531,890 B2 | 5/2009 | Kim |
| 7,557,597 B2 | 7/2009 | Anderson et al. |
| 7,579,435 B2 | 8/2009 | Culler et al. |
| 7,834,450 B2 | 11/2010 | Kang |
| 8,004,096 B2 * | 8/2011 | Fukuzono ............ H01L 21/563 257/676 |

(56) References Cited

U.S. PATENT DOCUMENTS

| | | | |
|---|---|---|---|
| 2003/0092217 A1 | 5/2003 | Coyle | |
| 2003/0178716 A1* | 9/2003 | Maeda | H01L 21/568 |
| | | | 257/686 |
| 2004/0238934 A1* | 12/2004 | Warner | H01L 23/24 |
| | | | 257/686 |
| 2005/0277231 A1* | 12/2005 | Hembree | H01L 21/563 |
| | | | 438/127 |
| 2006/0087033 A1* | 4/2006 | Goh | H01L 23/04 |
| | | | 257/737 |
| 2007/0238220 A1* | 10/2007 | Lii | H01L 21/563 |
| | | | 438/106 |
| 2008/0128916 A1* | 6/2008 | Soejima | H01L 21/561 |
| | | | 257/777 |
| 2009/0001602 A1 | 1/2009 | Chung | |
| 2009/0189258 A1 | 7/2009 | Mariani et al. | |
| 2009/0212420 A1* | 8/2009 | Hedler | H01L 21/56 |
| | | | 257/737 |
| 2011/0241218 A1 | 10/2011 | Meyer | |
| 2012/0193779 A1* | 8/2012 | Lee | H01L 23/3128 |
| | | | 257/737 |
| 2012/0211885 A1* | 8/2012 | Choi | H01L 23/3128 |
| | | | 257/737 |

\* cited by examiner

US 10,840,215 B2

SAWING UNDERFILL IN PACKAGING PROCESSES

PRIORITY CLAIM AND CROSS-REFERENCE

This application is a divisional of U.S. patent application Ser. No. 13/356,173, entitled "Sawing Underfill in Packaging Processes," filed on Jan. 23, 2012, which application is incorporated herein by reference.

BACKGROUND

In the packaging of integrated circuits, a plurality of dies may be bonded on an interposer wafer, which comprises a plurality of interposers therein. After the bonding of the dies, an underfill may be dispensed into the gaps between the dies and the interposer wafer. A curing process may then be performed to cure the underfill.

It was found that underfill may shrink after being cured. As a result, the cured underfill applies a force on the dies and the interposer wafer, and hence may cause the interposer wafer to have a warpage. The warpage of the interposer wafer further results in the process difficulty in the subsequent processes. For example, in a subsequent process (e.g. molding, grinding, thin film, or the like), the interposer wafer needs to be secured on a chuck table through vacuum. With the interposer wafer having the warpage, however, the interposer wafer may not be able to be secured on the chuck table.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A method of packaging integrated circuits is provided in accordance with various embodiments. The intermediate stages of forming a three-dimensional integrated circuit (3DIC) package in accordance with exemplary embodiments are illustrated. The variations of the embodiments are discussed. Throughout the various views and illustrative embodiments, like reference numbers are used to designate like elements.

Figure 1:
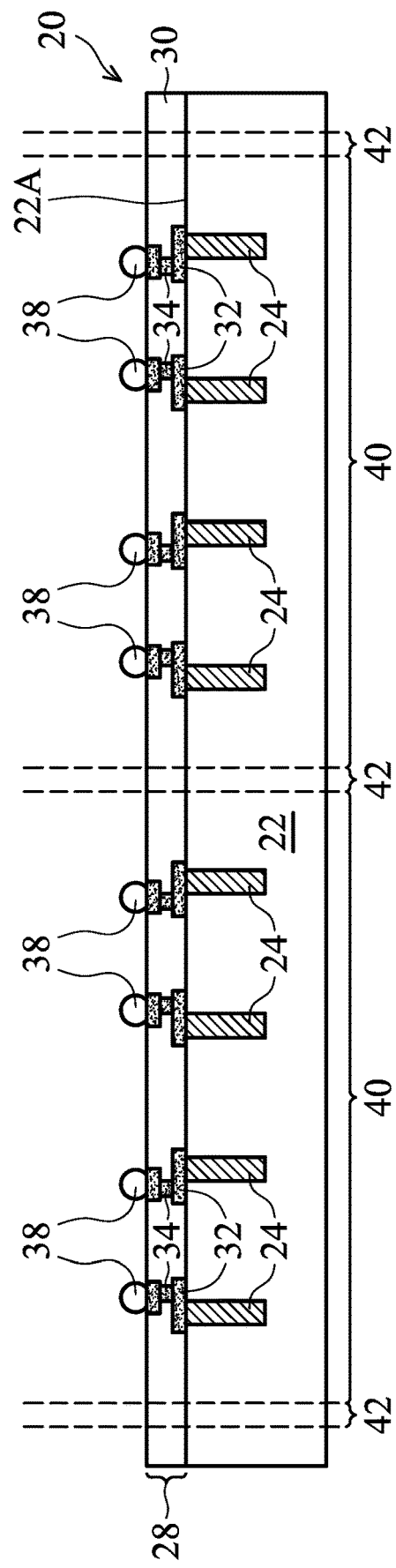
FIGS. 1 through 7C include cross-sectional views and a top view of intermediate stages in the manufacturing of a package in accordance with various exemplary embodiments.

FIGS. 1 through 7C are cross-sectional views of intermediate stages in the packaging of integrated circuits in accordance with some exemplary embodiments. FIG. 1 illustrates a cross-sectional view of package component 20. Package component 20 may include substrate 22. In some embodiments, substrate 22 is a semiconductor substrate, which may further be a crystalline silicon substrate, although it may comprise other semiconductor materials such as silicon germanium, silicon carbon, or the like. In alternative embodiments, substrate 22 is a dielectric substrate. Package component 20 may be a device wafer, which includes active devices such as transistors (not shown) formed at surface 22A of semiconductor substrate 22. When package component 20 is a device wafer, it may also include passive devices (not shown) such as resistors and/or capacitors. In alternative embodiments, package component 20 is an interposer wafer that does not have active devices therein. In these embodiments, package component 20 may include passive devices formed therein. Through-Substrate Vias (TVs) 24 may be formed to extend from top surface 22A of substrate 22 into substrate 22. TVs 24 are also sometimes referred as through-silicon vias when formed in a silicon substrate. Package component 20 includes a plurality of package components 40, which may be identical to each other. A plurality of scribe lines 42 are located between neighboring package components 40. Package components 40 may be device dies (also known as chips), interposer dies, or the like.

Interconnect structure 28 is formed over semiconductor substrate 22, and is used to electrically connect to the integrated circuit devices and/or TVs 24. Interconnect structure 28 may include a plurality of dielectrics layers 30. Metal lines 32 are formed in dielectric layers 30. Vias 34 are formed between, and interconnecting, the overlying and underlying metal lines 32. Metal lines 32 and vias 34 are sometimes referred to as Redistribution Layer (RDL) 32/34. In some embodiments, dielectric layers 30 comprise silicon oxide, silicon nitride, silicon carbide, silicon oxynitride, combinations thereof, and/or multi-layers thereof. Alternatively, dielectric layers 30 may comprise one or more low-k dielectric layer having low k values. The k values of the low-k dielectric materials in dielectric layers 30 may be lower than about 3.0, or lower than about 2.5, for example.

Connectors 38 are formed at the top surface of package component 20. In some embodiments, connectors 38 comprise metal pillars, wherein solder caps may be, or may not be, formed on the top surfaces of the metal pillars. In alternative embodiments, connectors 38 comprise solder regions. In yet other embodiments, connectors 38 may be composite bumps comprising copper posts, nickel layers, solder caps, Electroless Nickel Immersion Gold (ENIG), Electroless Nickel Electroless Palladium Immersion Gold (ENEPIG), and/or the like.

Figure 2:
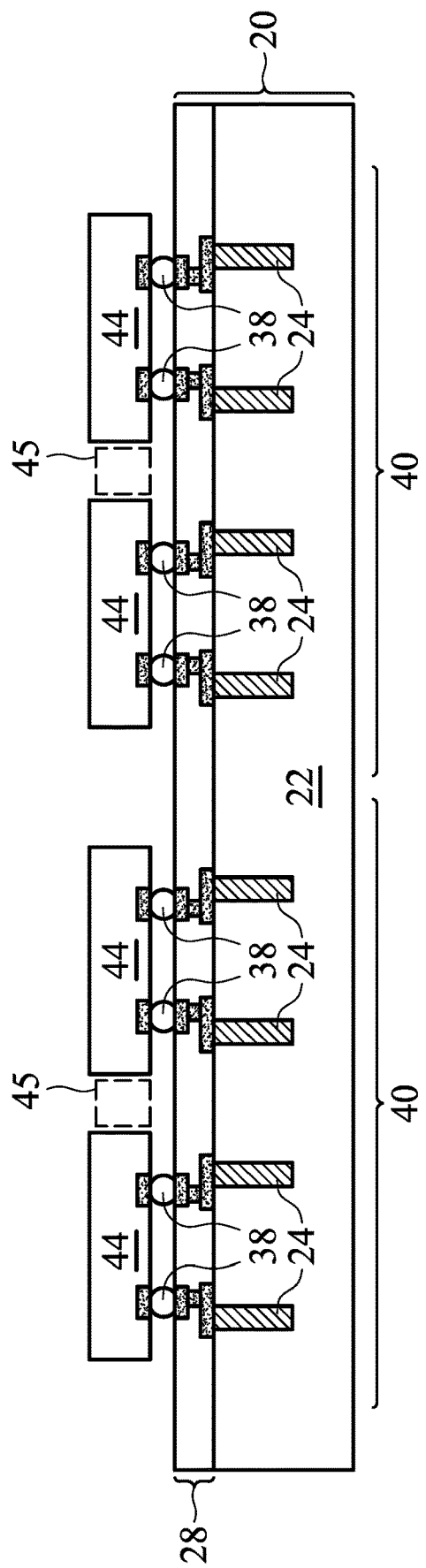

Referring to FIG. 2, package components 44 are bonded to package components 40, for example, through flip-chip bonding. Connectors 38 accordingly electrically couple the circuits in package components 44 to RDLs 32/34 and TVs 24 in package component 20. Package components 44 may be device dies comprising logic circuits, memory circuits, or the like. Accordingly, package components 44 are alternatively referred to as dies 44 hereinafter. Alternatively, package components 44 may comprise packages including dies bonded to the respective interposers, package substrates, and/or the like. On each of dies 40, there may be two or more dies 44 bonded thereon.

Figure 3:
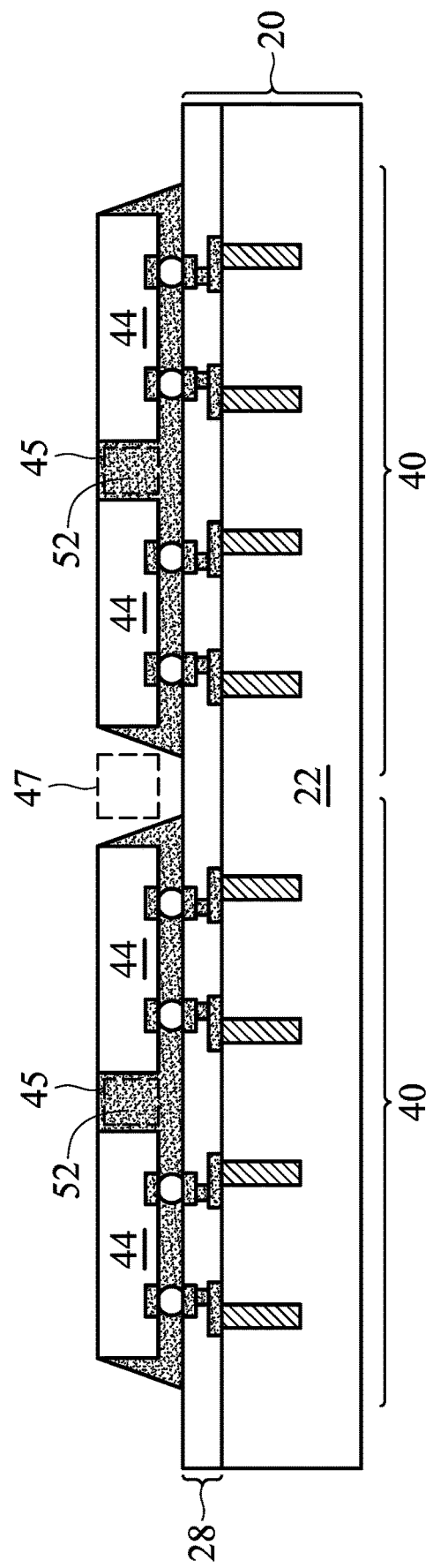

Next, as shown in FIG. 3, polymer 52 is dispensed into the space (gaps) between dies 44 and package component 20. Polymer 52 may be an underfill, and hence is referred to as underfill 52 hereinafter, although it may also comprise other polymers such as epoxy. Underfill 52 may also be a molding underfill. Underfill 52 is also filled into the gaps (marked as 45 in FIG. 2) between neighboring dies 44 that are bonded to the same package component 40. Underfill 52 may not be filled into gap 47, which is between neighboring dies 44 that are bonded to different package components 40. Alternatively, underfill 52 may be filled into gaps 47.

Underfill 52 is then cured in a curing process. After the curing process, underfill 52 is either partially cured or fully cured. After the partial curing or the full curing, underfill 52 becomes more solid than before the curing process. The partial-curing may not result in the full solidification of underfill 52. During the partial-curing of underfill 52, underfill 52 may contract (shrink), and the partial-curing at least does not result in underfill 52 to be fully contracted. The resulting underfill 52 may still appear as a gel after the partial-curing. In some embodiments, the curing process is performed using a thermal cure process. In which embodiments, the partial-curing is performed using lower temperatures and/or a shorter time duration than the respective temperatures and the time duration that are needed for fully curing underfill 52. In accordance with some exemplary embodiments, the partial-curing may be performed at temperatures between about 80° C. and about 120° C. The duration of the exemplary partial-curing step may be between about one hour and three hours. It is appreciated that the desirable partial-curing conditions may be related to the type of underfill 52. Furthermore, other curing methods such as Ultra-Violet (UV) curing may be used, depending on the type of underfill 52. When the curing process is a full curing process, underfill 52 is fully solidified.

Figure 4A:
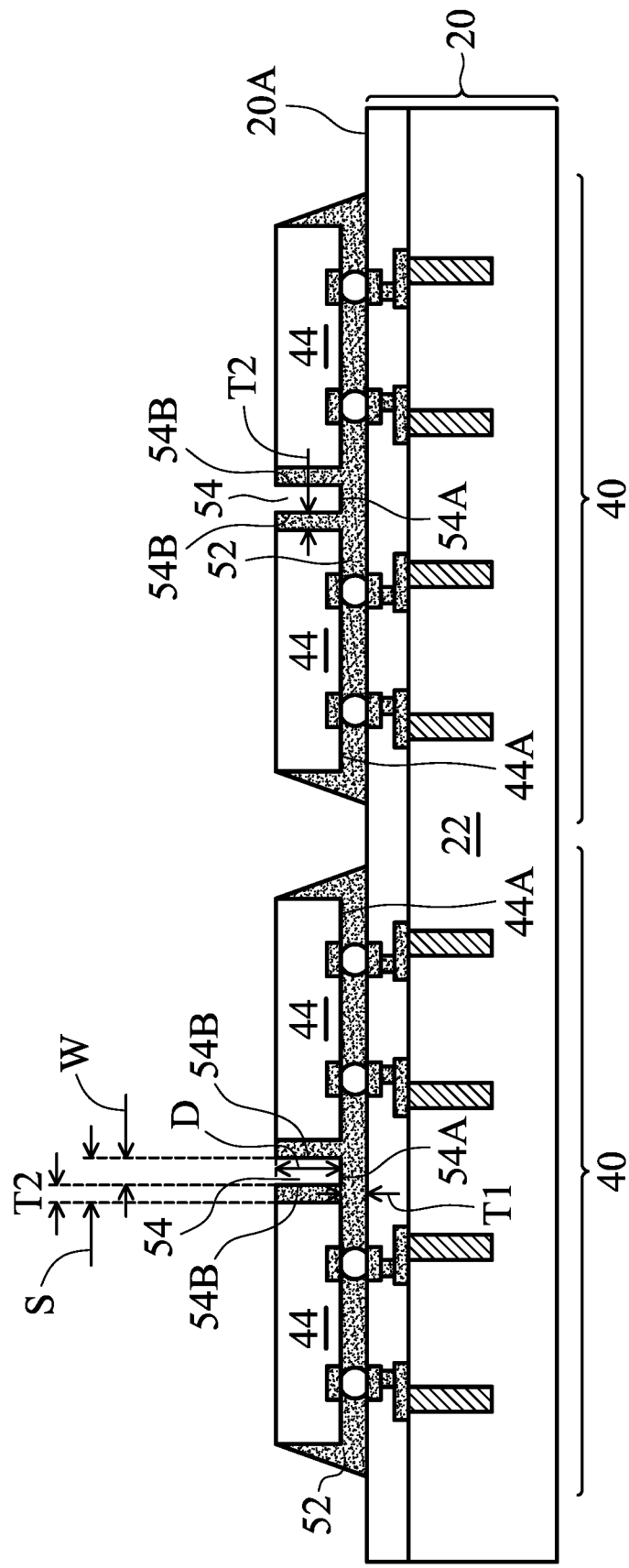
Figure 4B:
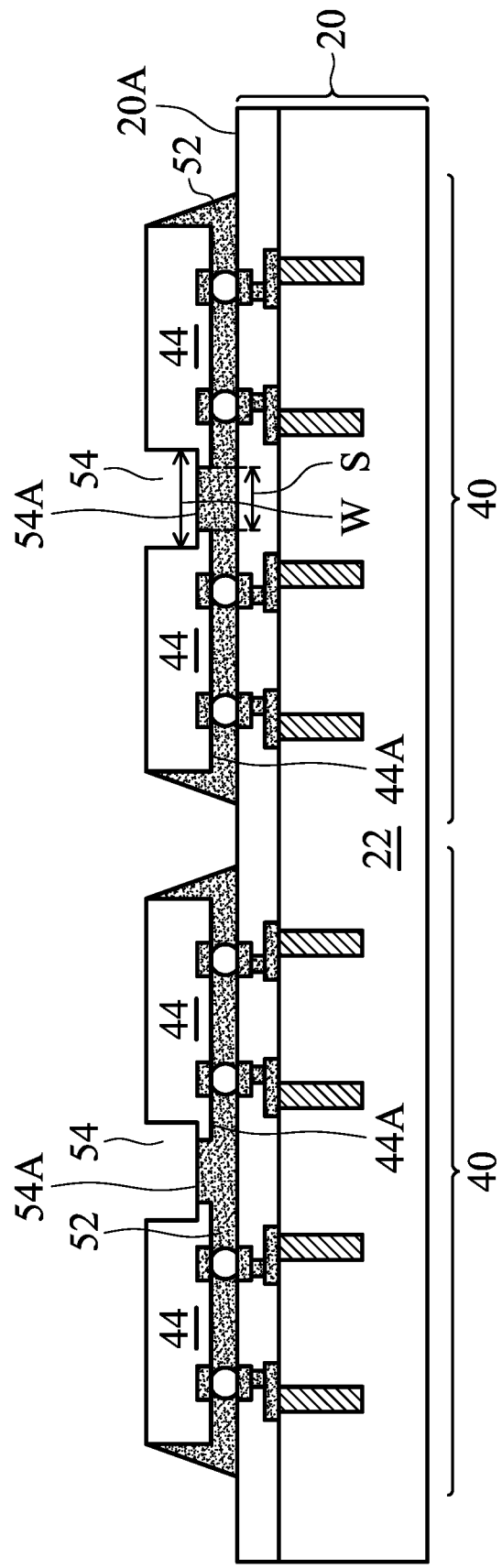
Figure 4C:
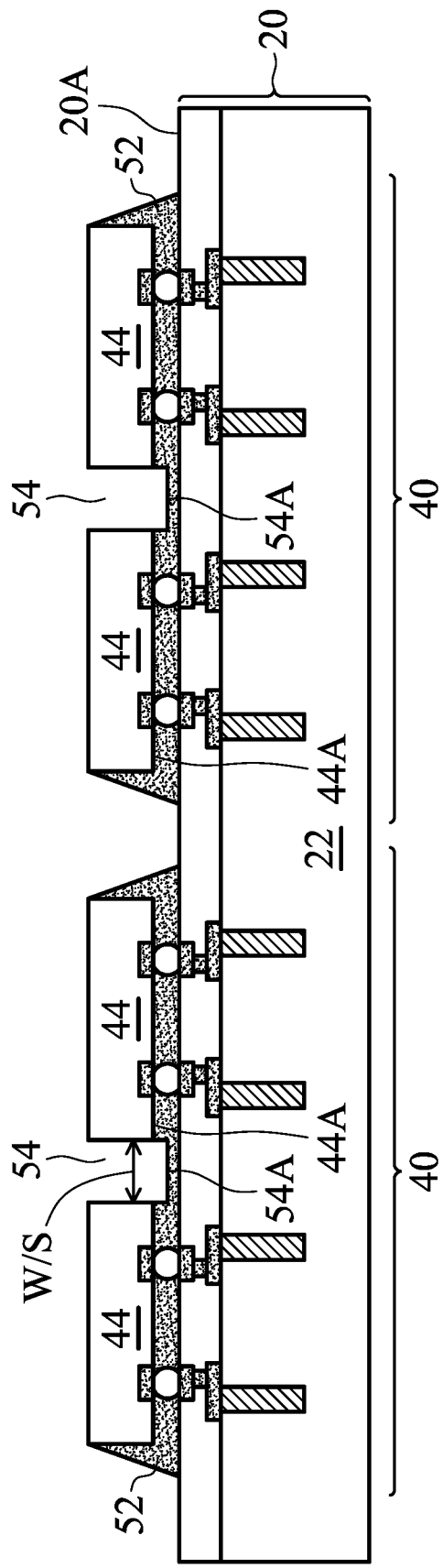

As shown in FIGS. 4A through 4C, a sawing step is performed on underfill 52 to form trenches 54. The sawing step may be performing using laser or a blade (not shown). In some embodiments, trenches 54 are formed between neighboring dies 44 that are bonded to the same die 40. In the embodiments wherein underfill 52 is also filled into the gap (47 in FIG. 3) between neighboring dies 44 that are bonded to different dies 40, trenches 54 may also be formed to cut the underfill portion that joins the neighboring dies 44 bonded to different dies 40. In some embodiments, portions of sidewalls 54B of trenches 54 are substantially perpendicular to top surface 20A of package component 20, which portions of sidewalls 54B are referred to as vertical sidewall portions hereinafter. In some embodiments, the vertical sidewall portions comprise the upper portions of sidewalls 54B.

In some exemplary embodiments, depth D of trenches 54 may be between about 5 percent and about 100 percent of the height measured from the top surface of die 44 to top surface 20A of package component 20. Width W of trenches 54 may be between about 5 μm and about 500 μm. Thickness T1 of the portion of underfill 52 that is directly under trenches 54 may be between about 0 μm and about 700 μm. As shown in FIG. 4A, bottoms 54A of trenches 54 may be substantially level with bottom surfaces 44A of dies 44. Alternatively, as shown in FIG. 4B, bottoms 54A may be higher than bottom surfaces 44A. As also shown in FIG. 4C, bottoms 54A of trenches 54 may also be lower than bottom surfaces 44A, and may be at any level higher than top surface 20A of package component 20.

Referring again to FIG. 4A, in some embodiments, width W of trenches 54 may be smaller than spacing S between neighboring dies 44. After the sawing step, some portions of underfill 52 may be left on the sidewalls of one or both of dies 44, and may be on one side or opposite sides of trenches 54. Thickness T2 of the remaining portions of underfill 52 may be between about 0 μm and about 500 μm, for example. FIG. 4B illustrates the package in accordance with alternative embodiments, wherein width W of trenches 54 may be greater than spacing S between neighboring dies 44. Accordingly, portions of dies 44 are sawed. FIG. 4C illustrates yet other embodiments, wherein width W of trenches 54 is substantially equal to spacing S.

In the embodiments wherein underfill 52 was partially cured, after the sawing, a thermal step (referred to as a thermal step hereinafter) is performed to anneal and cure underfill 52. The thermal step may be performed at temperatures higher than the glass transition temperatures. In accordance with some exemplary embodiments, the temperatures of the thermal step are between about 140° C. and about 170° C. The duration of the exemplary thermal step may be between about one hour and three hours, and may be between about 1.5 hours and about 2.5 hours, for example. The curing may cause underfill 52 to shrink. It is noted that if underfill 52 is not sawed, the portions of underfill 52 that are disposed between neighboring dies 44 will pull neighboring dies 44 toward each other, and hence causing the warpage of package component 20. In the embodiments, with the sawing step being performed, however, the shrinkage of underfill 52 no longer causes neighboring dies 44 to be pulled toward each other, and the warpage of package component 20 caused by the curing of underfill 52 is at least reduced, and may be substantially eliminated.

Figure 4D:
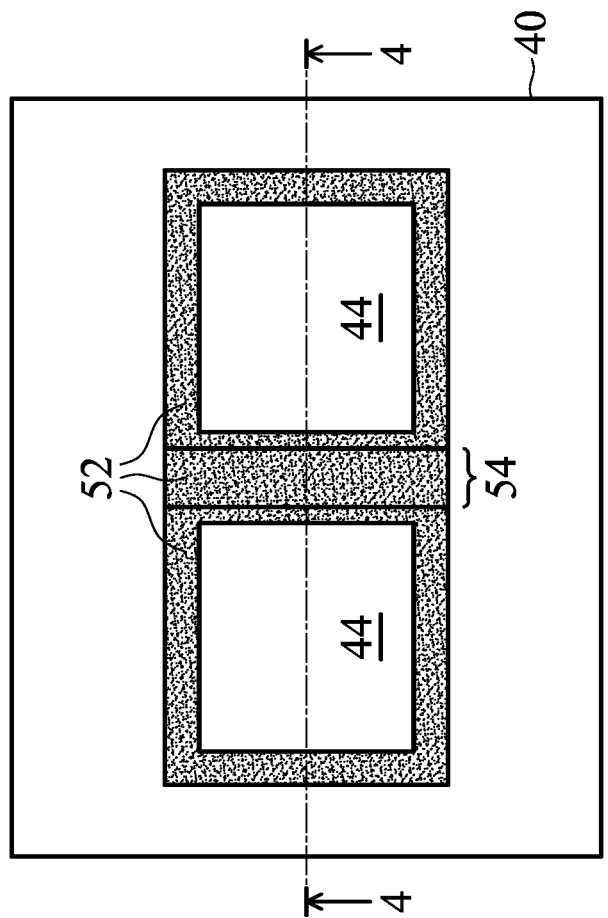

FIG. 4D illustrates a top view of a portion of the structure in FIGS. 4A through 4C, wherein the cross-sectional view shown in FIGS. 4A through 4C are obtained from the plane crossing line 4-4 in FIG. 4D. As shown in FIG. 4D, trench 54 may extend all the way from one edge of underfill 52 to the opposite edge, and hence the benefit of reducing the pulling force of underfill 52 may be maximized.

Figure 5A:
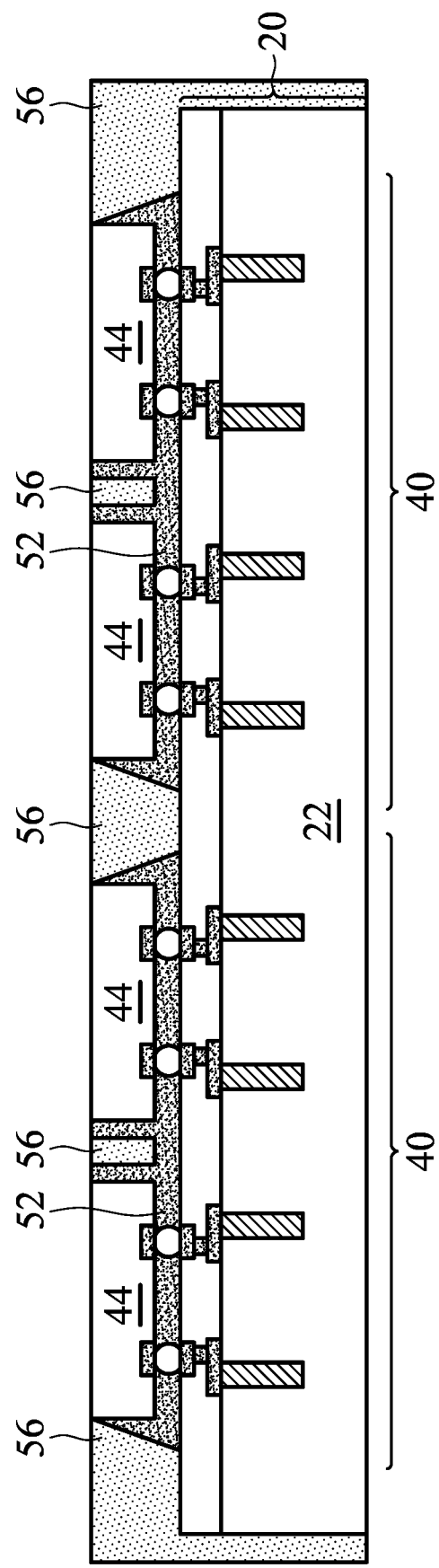
Figure 5B:
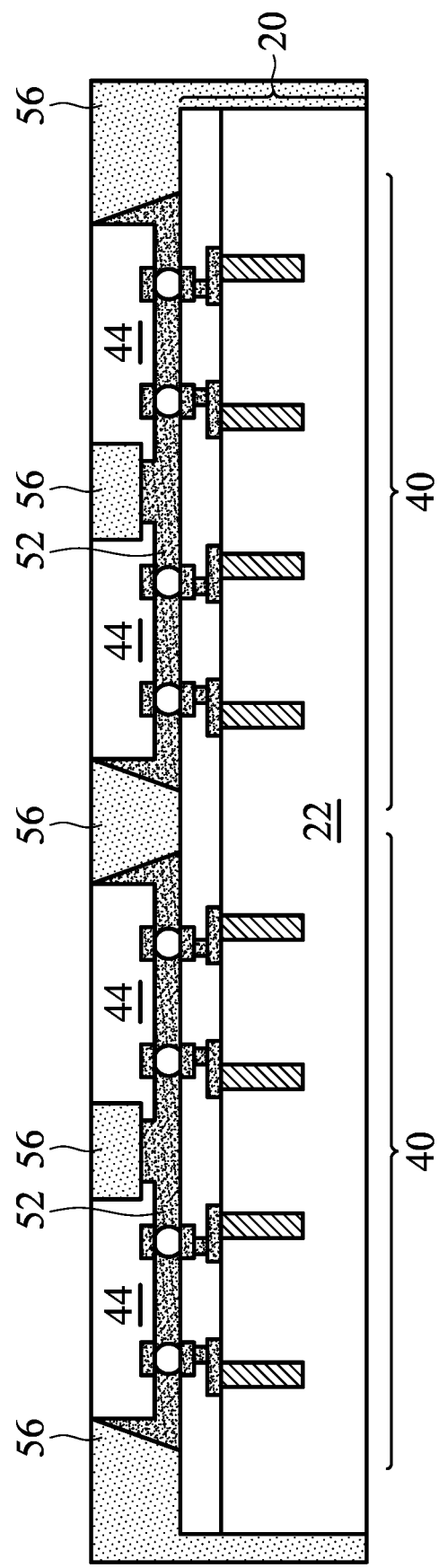
Figure 5C:
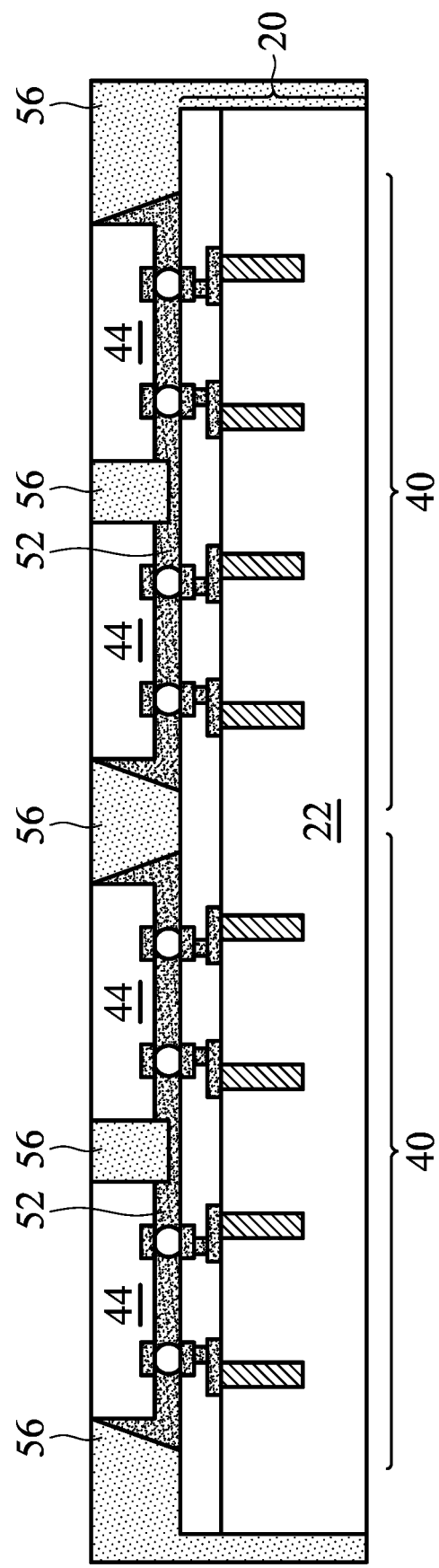

Next, as shown in FIGS. 5A through 5C, polymer 56 is molded on dies 44 and package component 20, for example, using compress molding. FIGS. 5A, 5B, and 5C are obtained from the structure shown in FIGS. 4A, 4B, and 4C, respectively. In some embodiments, polymer 56 comprises a molding compound, an epoxy, silicon, or the like. Polymer 56 may comprise first portions filling into trenches 54, second portions filling the spacing between neighboring dies 44 that are bonded on different dies 40, and third portions over dies 44. Polymer 56 is then cured. In some embodiments, after the curing of polymer 56, a planarization step, such as a grinding, may be performed to level the top surface of polymer 56, so that the third portions are removed and top surfaces of dies 44 are exposed.

Figure 6A:
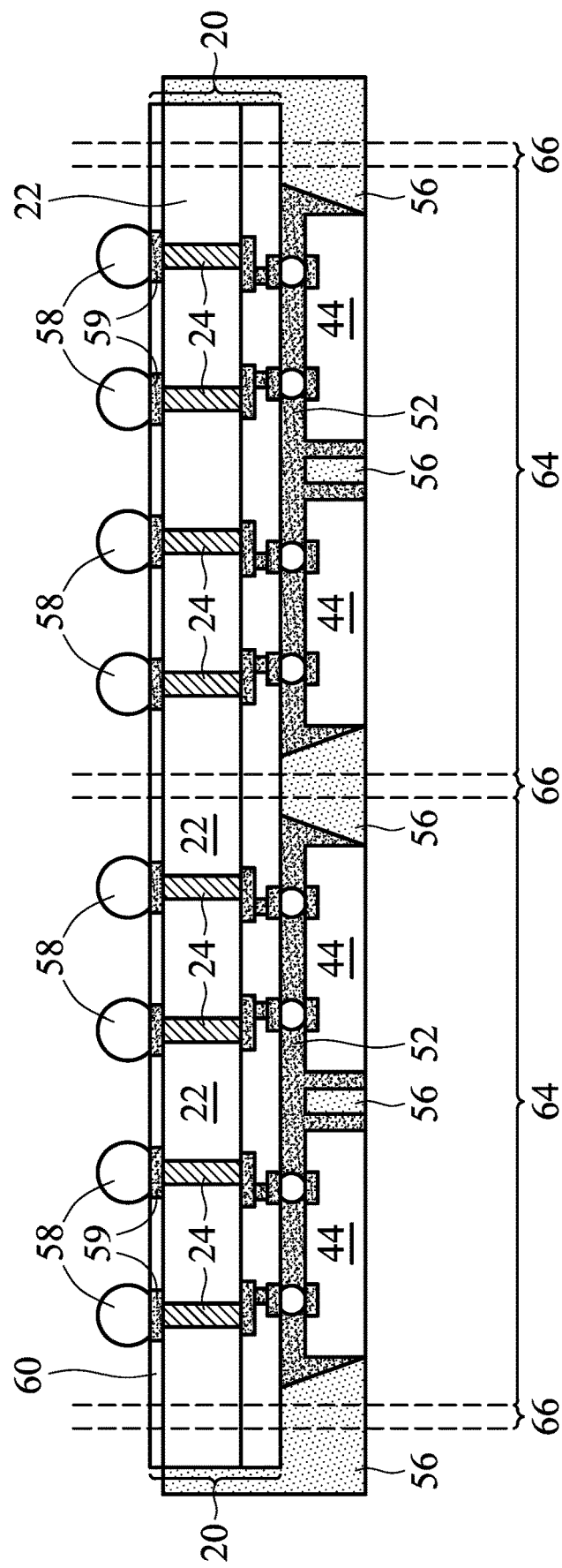
Figure 6B:
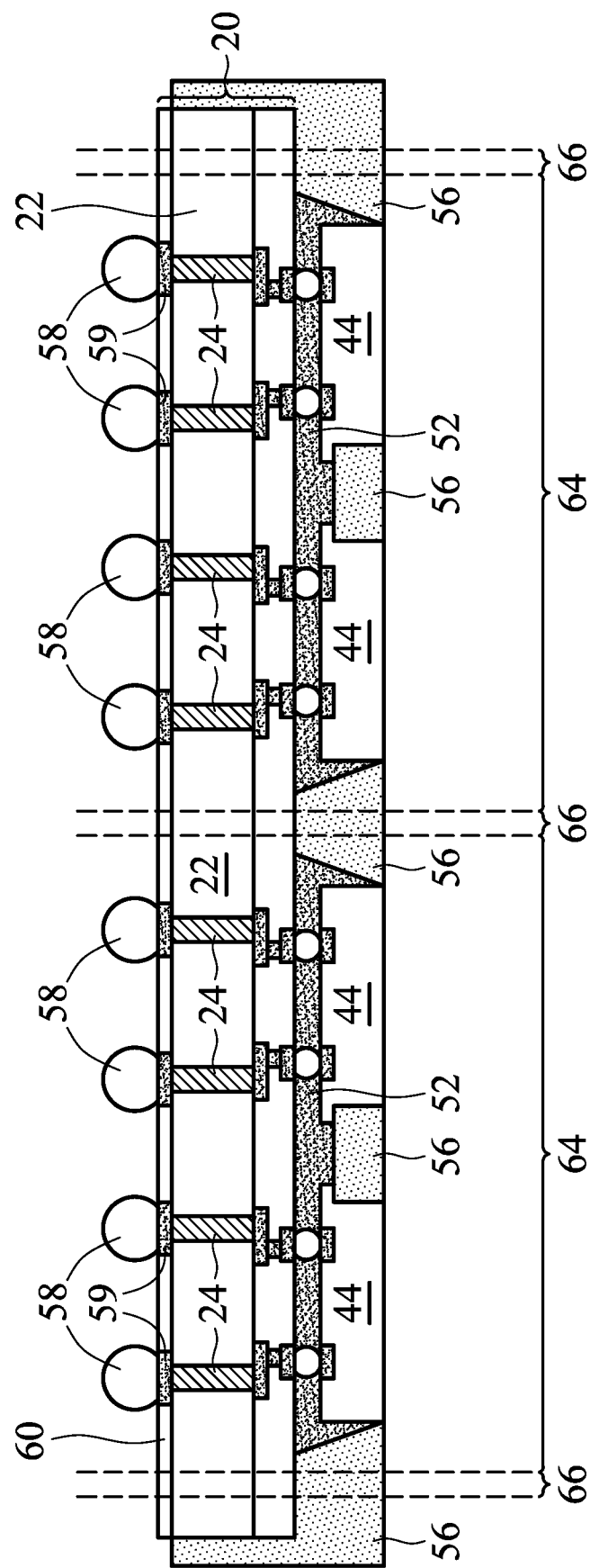
Figure 6C:
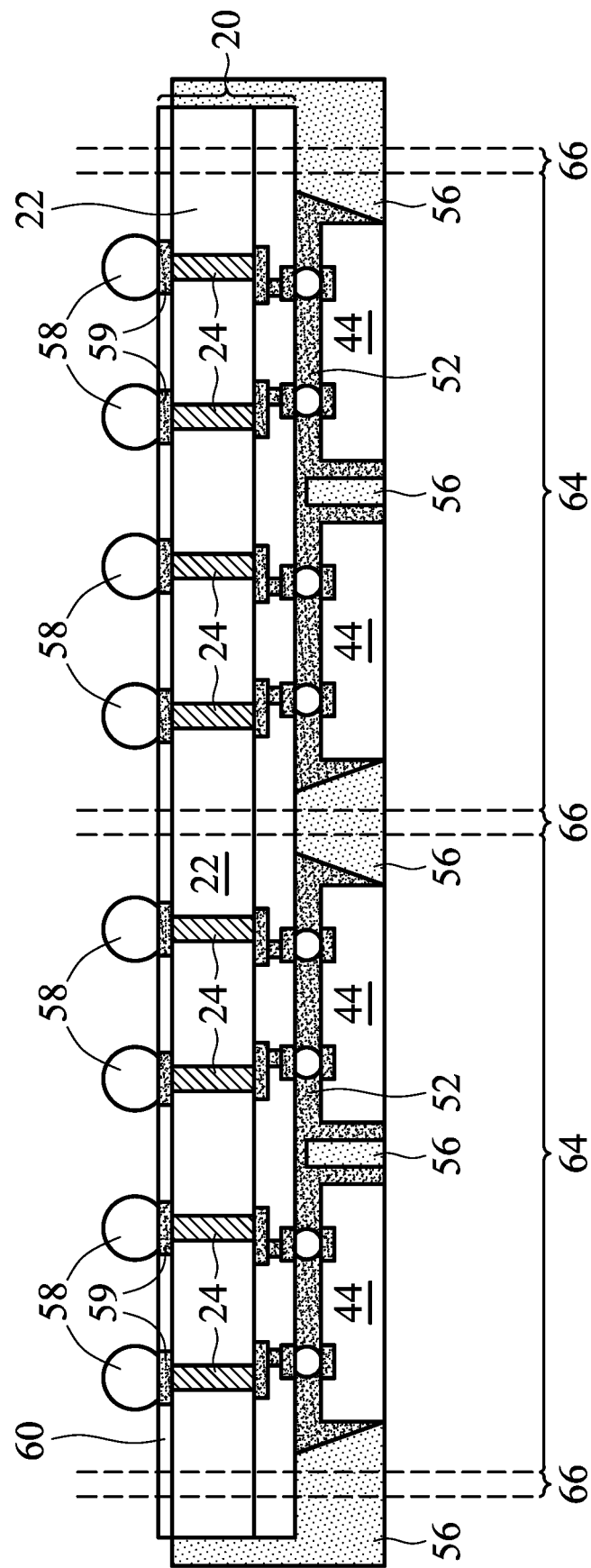

FIGS. 6A through 6C illustrate the formation of the backside structure of package component 20. FIGS. 6A, 6B, and 6C are obtained from the structures shown in FIGS. 5A, 5B, and 5C, respectively. In the formation of the backside structure, the package shown in FIG. 5A, 5B, or 5C is first flipped upside down, and semiconductor substrate 22 faces upwardly. A backside grinding is performed on the backside of semiconductor substrate 22 to thin semiconductor substrate 22, until TVs 24 are exposed. Dielectric layer (or dielectric layers) 60 is formed on the backside of semiconductor substrate 22. Connectors 58 are also formed on the backside of package component 20 and electrically coupled to TVs 24. In some embodiments, connectors 58 are solder balls. In other embodiments, connectors 58 may comprise metal pads, metal bumps, solder caps, or the like. RDLs may be optionally formed on the backside of package component 20 and in dielectric layers 60, wherein features 59 represent the RDLs. Connectors 58 may be used to bond to an additional electrical component (not shown), which may be a semiconductor substrate, package substrate, a printed circuit board (PCB), or the like.

Figure 7A:
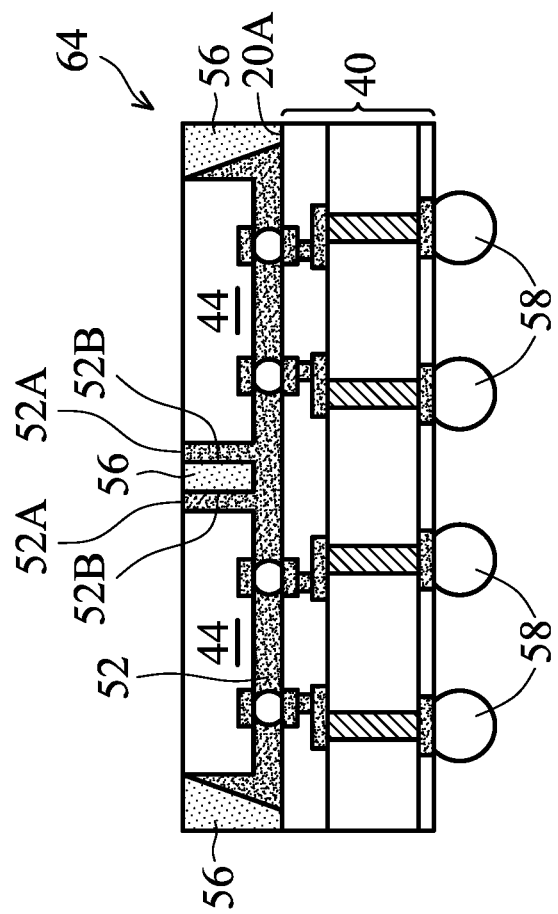
Figure 7B:
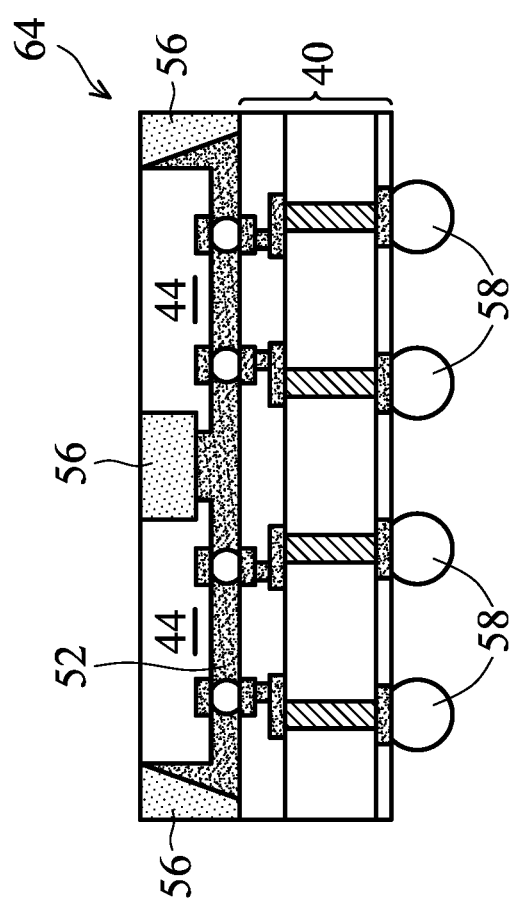
Figure 7C:
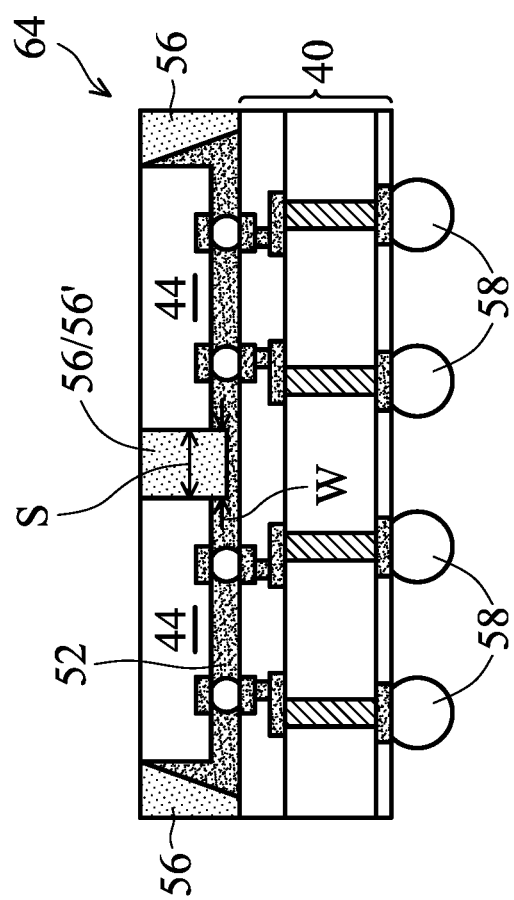

FIGS. 6A through 6C also illustrate the die-saw step for forming packages 64, wherein lines 66 represent the kerf lines. The resulting packages 64 obtained from the structures in FIGS. 6A, 6B, and 6C are illustrated in FIGS. 7A, 7B, and 7C, respectively. In the resulting packages 64 as in FIG. 7A, underfill 52 includes top surfaces 52A that is between neighboring dies 44. Sidewalls 52B of underfill 52 form steps with top surfaces 52A and the top surface of the portion of underfill 52 that is under polymer 56. Top surfaces 52A and sidewalls 52B also form abrupt transitions instead of smooth transitions. Furthermore, interfaces 52B between polymer 56 and underfill 52 may be substantial vertical. Portions (such as upper portions) of interfaces 52B may be substantially perpendicular to top surface 20A of die 40. Interfaces 52B are visible due to the fact that polymer 56 and underfill 52 are formed in different process steps, and due to the fact that polymer 56 and underfill 52 may comprise different polymers. In FIG. 7B, polymer 56 extends into portions of dies 44 due to the sawing of dies 44. In FIG. 7C, portion 56' of polymer 56 may have width W that is substantially equal to spacing S between neighboring dies 44.

In accordance with embodiments, by performing a partial-curing or a full curing on the underfill, sawing the underfill, and then performing a thermal annealing on the underfill, the warpage of the wafer that is underlying the underfill is significantly reduced. Experiments were made to form a first and a second sample package, respectively, from a first and a second sample wafer. The processes for forming the first and the second sample packages were similar to each other, except that when forming the first sample package, no partial-curing and sawing were performed on the respective underfill. The resulting warpage of the first sample wafer was about 800 µm. As a comparison, the partial-curing and sawing steps were performed on the respective underfill during the formation of the second sample package. The warpage of the second sample wafer was reduced to about 350 µm. This indicates that the underfill partial-curing and sawing may cause a significant reduction in the warpage of the wafers.

In accordance with embodiments, a method includes bonding a first and a second package component on a top surface of a third package component, and dispensing a polymer. The polymer includes a first portion in a space between the first and the third package components, a second portion in a space between the second and the third package components, and a third portion in a gap between the first and the second package components. A partial-curing is then performed on the polymer. After the curing, the third portion of the polymer is sawed to form a trench between the first and the second package components.

In accordance with other embodiments, a method includes bonding a first die and a second die on a top surface of each of a plurality of dies of a wafer, and dispensing an underfill to the spaces between the first and the second dies and the wafer. The underfill includes a portion disposed in a gap between the first and the second dies. A curing step is performed to harden the underfill. After the curing step, the portion of the underfill in the gap is sawed to form a trench. After the step of sawing, a thermal step is performed to anneal the underfill.

In accordance with yet other embodiments, a device includes a first package component, and a second package component and a third package component bonded to a top surface of the first package component. A first polymer region includes a first portion contacting a first sidewall of the first package component, wherein the first portion is in the gap between the second package component and the third package component. A second polymer region is disposed in the gap, wherein the second polymer contacts a sidewall of the first portion of the first polymer to form a visible interface. The visible interface includes a portion substantially perpendicular to the top surface of the first package component.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A package comprising:
   a first package component;
   a second package component and a third package component bonded to a top surface of the first package component;
   a first polymer region comprising:
      a first portion overlapping the first package component, wherein the first portion is in a gap between the second package component and the third package component, wherein the first portion comprises:
         a first sub-portion having a sidewall contacting a sidewall of the second package component to form a first vertical interface; and
         a second sub-portion having a sidewall contacting a sidewall of the third package component to form a second vertical interface parallel to the first vertical interface; and
      a second portion and a third portion, wherein the second portion and the first portion of the first polymer region are on opposite sides of the second package component, and the third portion and the first portion of the first polymer region are on opposite sides of the third package component, wherein the first portion, the second portion, and the third portion of the first polymer region are portions of a continuous region with no distinguishable interface therein to separate different portions of the continuous region from each other; and
   a second polymer region comprising a portion in the gap, wherein the portion of the second polymer region comprises:
      a bottom surface contacting a top surface of the first portion of the first polymer region;
      a first sidewall contacting the first sub-portion to form a third vertical interface; and
      a second sidewall contacting the second sub-portion to form a fourth vertical interface parallel to the third vertical interface.

2. The package of claim 1, wherein the first polymer region and the second polymer region are formed of different materials, and the bottom surface, the first sidewall, and the second sidewall of the portion of the second polymer layer form a U-shape.

3. The package of claim 1, wherein the first polymer region comprises an underfill, and the second polymer region comprises a molding compound.

4. The package of claim 1, wherein the second package component and the third package component comprise device dies, and the bottom surface, the third vertical interface, and the fourth vertical interface form a U-shape.

5. The package of claim 1, wherein the bottom surface of the second polymer region is substantially level with or lower than bottom surfaces of the second package component and the third package component.

6. The package of claim 1, wherein top ends of the third vertical interface and the fourth vertical interface are at a same level as top surfaces of the first package component and the second package component.

7. A package comprising:
an interposer;
a first device die and a second device die bonded to a top surface of the interposer;
an underfill comprising:
 a first portion between the interposer and the first device die;
 a second portion between the interposer and the second device die;
 a third portion over the interposer and between the first device die and the second device die, wherein the third portion has a planar top surface substantially parallel to a top surface of the first device die; and
 a fourth portion contacting a sidewall of the first device die, wherein the third portion and the fourth portion are on opposite sides of the first device die, and the fourth portion has a slanted top surface, wherein the first portion, the second portion, the third portion, and the fourth portion of the underfill are formed of a same material; and
a molding compound comprising a first portion in a gap between the first device die and the second device die, wherein each of the first device die and the second device die comprises a portion overlapped by the first portion of the molding compound, and the first portion of the molding compound is at a same level as a portion of the first device die, and wherein the first portion of the molding compound comprises:
 a first bottom surface contacting the planar top surface of the third portion of the underfill; and
 a second bottom surface contacting a top surface of the first device die, wherein the first bottom surface and the second bottom surface are at a same level, and are continuously connected.

8. The package of claim 7, wherein the first portion of the molding compound further comprises:
a first stop surface directly above the first bottom surface; and
a second top shelf directly above the second bottom surface, wherein both of the first top surface and the second top surface are planar surfaces that are coplanar with the top surface of the first device die.

9. The package of claim 7, wherein the first portion, the second portion, the third portion, and the fourth portion of the underfill form a continuous region, with no distinguishable interface in the continuous region to separate different portions of the continuous region from each other.

10. The package of claim 7, wherein both of the first bottom surface and the second bottom surface are planar surfaces.

11. A package comprising:
a first device die;
a second device die;
an interposer bonded to both the first device die and the second device die;
a molding compound comprising a first portion between the first device die and the second device die, wherein the first portion of the molding compound comprises:
 a first sidewall;
 a second sidewall opposite to the first sidewall; and
 a bottom surface connecting the first sidewall to the second sidewall;
an underfill comprising:
 a first portion between the interposer and the first device die;
 a second portion between the interposer and the second device die; and
 a third portion having a first top surface contacting the bottom surface of the first portion of the molding compound, and opposite sidewalls of the third portion are in contact with the first sidewall and the second sidewall of the first portion of the molding compound to form a first vertical interface and a second vertical interface, respectively, wherein the first vertical interface, the second vertical interface, and the bottom surface of the first portion of the molding compound in combination form a U-shape, wherein the first portion, the second portion, and the third portion of the underfill are continuously connected to form a continuous region with no interface therein to separate different portions of the continuous region from each other, and wherein the first portion of the molding compound is separated from the first device die and the second device die by the third portion of the underfill.

12. The package of claim 11, wherein the first portion of the molding compound has a top surface substantially coplanar with top surfaces of the first device die and the second device die, and the first vertical interface and the second vertical interface extends to a same height as the top surface of the first portion of the molding compound.

13. The package of claim 11, wherein entireties of the U-shape are formed of interfaces between the first portion of the molding compound and the third portion of the underfill.

14. The package of claim 11, wherein the molding compound further comprises a second portion, wherein the first portion and the second portion of the molding compound are separated from each other by the underfill and the first device die.

15. The package of claim 1, wherein top surfaces of the second portion and the third portion of the first polymer region are coplanar with a top surface of the portion of the second polymer region.

16. The package of claim 11, wherein the first portion of the underfill comprises a top surface contacting a bottom surface of the first device die, and a bottom surface contacting a top surface of the interposer.

17. The package of claim 11, wherein the third portion of the underfill further comprises:
a first sub portion in contact with the first device die; and
a second sub portion in contact with the second device die, wherein the first sub portion and the second sub portion are on opposite sides of the first portion of the molding compound, and the first sub portion and the second sub portion of the third portion of the underfill are in contact with the first sidewall and the second sidewall, respectively, of the first portion of the molding compound to form a first interface and a second interface, respectively, and the first interface and the second interface are parallel to each other.

18. The package of claim 12, wherein the first vertical interface and the second vertical interface are join to the bottom surface of the first portion of the molding compound.

19. The package of claim 1, wherein the bottom surface of the portion of the second polymer region is planar.

20. The package of claim 11, wherein the bottom surface of the first portion of the molding compound is planar.

* * * * *

UNITED STATES PATENT AND TRADEMARK OFFICE
CERTIFICATE OF CORRECTION

PATENT NO. : 10,840,215 B2  
APPLICATION NO. : 15/483689  
DATED : November 17, 2020  
INVENTOR(S) : Szu-Wei Lu Page 1 of 1

It is certified that error appears in the above-identified patent and that said Letters Patent is hereby corrected as shown below:

In the Claims

In Column 7, Line 57, Claim 8, delete "a first stop surface" and insert --a first top surface--.

In Column 7, Line 59, Claim 8, delete "a second top shelf" and insert --a second top surface--.

Signed and Sealed this  
Second Day of February, 2021

Drew Hirshfeld  
*Performing the Functions and Duties of the*  
*Under Secretary of Commerce for Intellectual Property and*  
*Director of the United States Patent and Trademark Office*